United States Patent [19]
Chen

[11] Patent Number: 6,075,726
[45] Date of Patent: Jun. 13, 2000

[54] HIGH SPEED SENSING CIRCUIT FOR A MEMORY DEVICE

[75] Inventor: Chien-Chung Chen, Hsinchu, Taiwan

[73] Assignee: Winbond Electronics Corporation, Taiwan

[21] Appl. No.: 09/206,363

[22] Filed: Dec. 7, 1998

[51] Int. Cl.[7] .................................................. G11C 16/06
[52] U.S. Cl. ...................... 365/185.21; 365/206; 365/207
[58] Field of Search .............................. 365/185.21, 205, 365/206, 207

[56] References Cited

U.S. PATENT DOCUMENTS

| | | | |
|---|---|---|---|
| 5,029,138 | 7/1991 | Iwashita .................................... | 365/208 |
| 5,386,158 | 1/1995 | Wang ........................................ | 327/51 |
| 5,519,652 | 5/1996 | Kumakura et al. ................. | 365/185.21 |
| 5,625,586 | 4/1997 | Yamasaki et al. ....................... | 365/104 |
| 5,659,260 | 8/1997 | Kajimoto et al. .......................... | 327/55 |
| 5,910,914 | 6/1999 | Wang ................................... | 365/185.21 |

*Primary Examiner*—David Nelms
*Assistant Examiner*—Hien Nguyen
*Attorney, Agent, or Firm*—Finnegan, Henderson, Farabow, Garrett & Dunner, L.L.P.

[57] ABSTRACT

A sensing circuit for sensing the binary state of a memory cell in a non-volatile memory device that includes an amplifier electrically connected to the memory cell and current generating circuitry connected to the amplifier for generating a first current in response to one binary state of the memory cell and a second current in response to another binary state of the memory cell. The sensing circuit also includes circuitry to speed initialization of the current generating circuitry and circuitry to prevent transient noise in the output of the sensing circuit during initialization of the current generating circuitry.

22 Claims, 2 Drawing Sheets

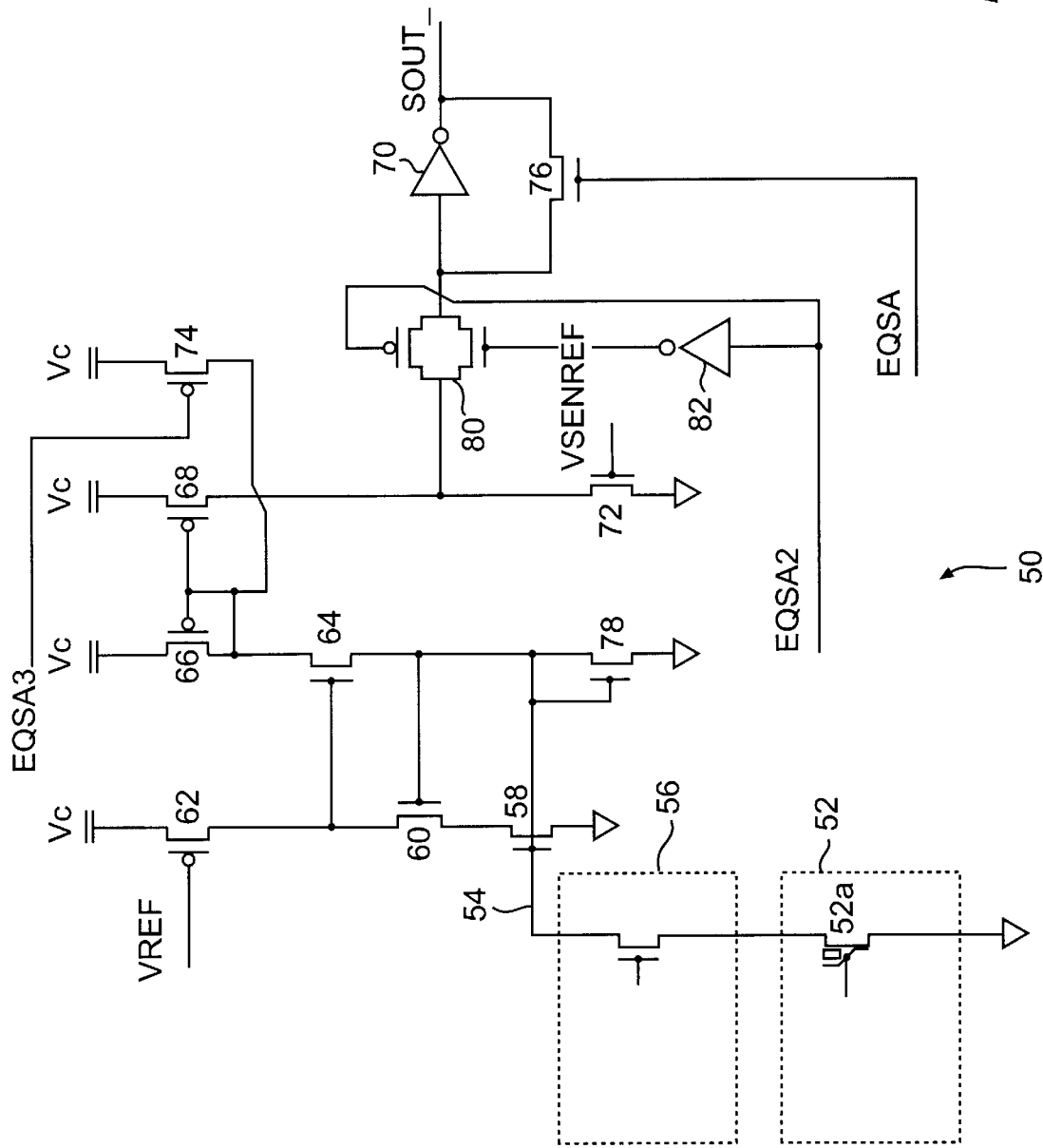

HIGH SPEED SENSING CIRCUIT FOR A MEMORY DEVICE

BACKGROUND OF THE INVENTION

1. Field of the Invention

This invention pertains in general to a non-volatile memory device and, more particularly, to a sensing circuit of a non-volatile memory device.

2. Description of the Related Art

Sensing circuits, or sense amplifiers, are commonly used in non-volatile memory devices to ascertain the binary states of the devices. For example, U.S. Pat. No. 5,386,158 ("the '158 patent") discloses a sensing circuit for a floating-gate memory device.

FIG. 1 shows a portion of the circuitry illustrated in FIG. 2a of the '158 patent. Referring to FIG. 1, the '158 patent discloses a sensing circuit 10 comprised of primarily MOS transistors. Sensing circuit 10 is coupled to a memory array 12 that includes a plurality of non-volatile memory cells 12a, 12b ... 12n, only one of which (12a) is shown. Memory array 12 is connected to a sensing line 80 through a multiplexer 16. Sensing line 80 connects to the gate of an n-type transistor 36. The source of transistor 36 is connected to a ground potential and the drain is connected to the source of an n-type transistor 34. The terms "source" and "drain," as well known in the art, can be used interchangeably. The drain and gate of transistor 34 are connected together and also to the drain of a p-type transistor 32. The gate of transistor 32 is connected to a reference potential $V_{REF}$, and the source is connected to a voltage potential $V_c$. Transistors 32, 34, and 36 operate as a voltage amplifier.

The gate and drain of transistor 34 are also connected to the gate of an n-type transistor 44. The drain of transistor 44 is connected to the drain and the gate of a p-type transistor 40 and also the gate of a p-type transistor 42. The source of transistor 40 and the source of transistor 42 are connected to voltage potential $V_c$. Transistors 40, 44, and 42 operate as a current mirror. The drain of transistor 42 is connected to the input of an inverter 28 and the drain of an n-type transistor 48. The source of transistor 48 is connected to a ground potential and the gate is connected to a reference voltage $V_{SENREF}$. Inverter 28 provides an output $S_{OUT}$.

Sensing line 80 is additionally connected to the drain and the gate of an n-type transistor 46. The drain and the gate of transistor 46 are also connected to the source of transistor 44. The source of transistor 46 is connected to a ground potential.

As described by the '158 patent, transistors 34 and 44 will be on regardless of the conductive state of the memory cell being sensed, for example, memory cell 12a. When memory cell 12a is in a conductive state, transistor 34 generates a first voltage to maintain the voltage at sensing line 80. Current then flows from transistor 40, through transistor 44, to sensing line 80 to maintain the conductive state of memory cell 12a. When memory cell 12a is in a non-conductive state, there is no current flow in sensing line 80 initially. Because transistor 44 is on, the voltage on sensing line 80 will subsequently be charged up. When the voltage on sensing line 80 increases, the voltage at the gate of transistor 34 drops, generating a second voltage. Transistor 40 continues to supply current to sensing line 80 through transistor 44 until sensing line 80 reaches a saturation level, at which point transistor 46, also known as a "leaker," conducts excess current to ground to prevent the voltage on sensing line 80 from cutting off transistor 44.

The sensing operation is conducted through transistors 40, 42, 48 and inverter 28. Depending upon the net current flow into or out from the input of inverter 28, $S_{OUT}$ will either be high or low. Because the current flow through transistor 42 mirrors the current flow through transistor 40, the current flow to the input of inverter 28 also mirrors the current flow through transistor 40. The '158 patent additionally describes how reference voltage $V_{SENREF}$ is generated from which the net current flow into inverter 28 is determined. The '158 patent is hereby incorporated by reference.

When sensing circuit 10 is first enabled, transistors 40 and 42 are operating in the cut-off region. If $V_{SENREF}$ is provided to transistor 48, which turns transistor 48 on, while transistors 40 and 42 are off, output signal $S_{OUT}$ will be pulled to zero, creating a transition output noise. Damping noise may also be created during the same period between transistors 40 and 42 as transistor 42 generates a current that "mirrors" the charging current through transistor 40. In addition, because only one current path, namely the one through transistors 40 and 44, is provided to sensing line 80, insufficient charging current is provided to bring sensing circuit 10 from the cut-off region into its linear operating region within a short enough period of time to avoid transition noises or to allow sensing circuit 10 to provide high sensing speed.

SUMMARY OF THE INVENTION

Accordingly, the present invention is directed to a high speed sensing circuit for a non-volatile memory device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided a sensing circuit for sensing the binary state of a memory cell in a non-volatile memory device that includes an amplifier electrically connected to the memory cell, a first transistor having first and second spaced-apart regions and a gate wherein the first spaced-apart region is connected to a first voltage source and the gate is connected to the second spaced-apart region, and a second transistor having first and second spaced-apart regions and a gate wherein the first spaced-apart region of the second transistor is connected to the gate and the second spaced-apart region of the first transistor, and the gate and the second spaced-apart region of the second transistor is connected to the amplifier such that a feedback circuit is created between the second transistor and the amplifier. The sensing circuit also includes a third transistor having first and second spaced-apart regions and a gate wherein the first spaced-apart region is connected to the first voltage source, and the gate of the third transistor is connected to the gate and the second-spaced apart region of the first transistor such that a first current is generated in response to one binary state of the memory cell and a second current is generated in response to another binary state of the memory cell. The circuit additionally includes a fourth transistor having first and second spaced-apart regions and a gate wherein the first spaced-apart region is connected to the first voltage source, the gate is provided with a first clock signal, and the second spaced-apart region is connected to the gate of the first transistor and the gate of the third transistor, and means, connected to the second spaced-apart region of the third transistor, for producing a first output signal in response to the first current and a second output signal in response to the second current.

In one aspect of the invention, the sensing circuit further includes a fifth transistor having first and second spaced-apart regions and a gate wherein the first spaced-apart region is connected to an input of the means for producing output signals, the second spaced-apart region is connected to an output of the means for producing output signals, and the gate is provided with a second clock signal.

In another aspect of the invention, the sensing circuit includes means for reducing transient noise in the output signals during the initial phase of operation of the first and third transistors.

In another aspect of the invention, the means for reducing transient noise includes means for passing current having first, second, third and fourth terminals wherein the first terminal is connected to the second spaced-apart region of the third transistor, the second terminal is provided with a third clock signal, and the third terminal is connected to the input of the first inverter means, and an inverter having an input and an output wherein the output of the inverter is connected to the fourth terminal of the means for passing current, and the input of the inverter is connected to the second terminal of the means for passing current and to the third clock signal.

In yet aspect of the invention, the first clock signal has a pulse of a first duration, and the third clock signal has a pulse of a third duration.

In still another aspect of the invention, the third duration is longer than the first duration.

Also in accordance with the invention, a sensing circuit for sensing the binary state of a memory cell in a non-volatile memory device that includes a first transistor having first and second spaced-apart regions and a gate wherein the first spaced-apart region is connected to a first voltage source, and the gate is connected to a second voltage source, a second transistor having first and second spaced-apart regions and a gate wherein the first spaced-apart region of the second transistor is connected to the second spaced-apart region of the first transistor, and a third transistor having first and second spaced-apart regions and a gate wherein the first spaced-apart region is connected to the second spaced-apart region of the second transistor, the gate is connected to the memory cell, and the second spaced-apart region is connected to a ground potential. The sensing circuit also includes means for generating a first current in response to one binary state of the memory cell and a second current in response to another binary state of the memory cell wherein the means for generating currents is connected to the first spaced-apart region and the gate of the second transistor such that a feedback circuit is created between the means for generating currents and the second transistor, and means, connected to the means for generating currents, for producing a first output signal in response to the first current and a second output signal in response to the second current, and means, connected to an output of the means for generating currents, for reducing transient noise in the output signals during the initial phase of operation of the means for generating currents.

In one aspect of the invention, means for generating currents includes a fourth transistor having first and second spaced-apart regions and a gate wherein the first spaced-apart region is connected to the first voltage source and the gate is connected to the second spaced-apart region, a fifth transistor having first and second spaced-apart regions and a gate wherein the first spaced-apart region of the fifth transistor is connected to the gate and the second spaced-apart region of the fourth transistor, the gate of the fifth transistor is connected to the second spaced-apart region of the first transistor and to the first spaced-apart region of the second transistor, and the second spaced-apart region of the fifth transistor is connected to the gate of the second transistor and to the gate of the third transistor such that the feedback circuit is created between the second transistor and the fifth transistor. The sensing circuit also includes a sixth transistor having first and second spaced-apart regions and a gate wherein the first spaced-apart region is connected to the first voltage source, the gate of the sixth transistor is connected to the gate and the second-spaced apart region of the fourth transistor, and the second spaced-apart region is connected to the means for producing output signals.

In another aspect of the invention, the sensing circuit also includes means for enhancing the speed of the fourth and sixth transistors to reach linear operating regions from cut-off regions.

In yet another aspect of the invention, the operating speed enhancing means includes a seventh transistor having first and second spaced-apart regions and a gate wherein the first spaced-apart region is connected to the first voltage source, the gate is provided with a first clock signal, and the second spaced-apart region is connected to the gate of the fourth transistor and to the gate of the sixth transistor.

Also in accordance with the present invention, a sensing circuit for sensing the binary state of a memory cell in a non-volatile memory device includes an amplifier electrically connected to the memory cell, means for generating a first current in response to one binary state of the memory cell and a second current in response to another binary state of the memory cell wherein the means for generating currents is connected to the amplifier, means, connected to the means for generating currents, for producing a first output signal in response to the first current and a second output signal in response to the second current, and means, connected to the means for generating currents, for reducing transient noise in the output signals during the initial phase of operation of the means for generating currents.

In one aspect of the invention, the sensing circuit further includes means, connected to the means for generating currents, for enhancing the speed of initialization of operation of the means for generating currents.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings:

FIG. 2 is a schematic diagram of an embodiment of the present invention.

DETAILED DESCRIPTION OF THE PREFERRED EMBODIMENTS

Figure 1:
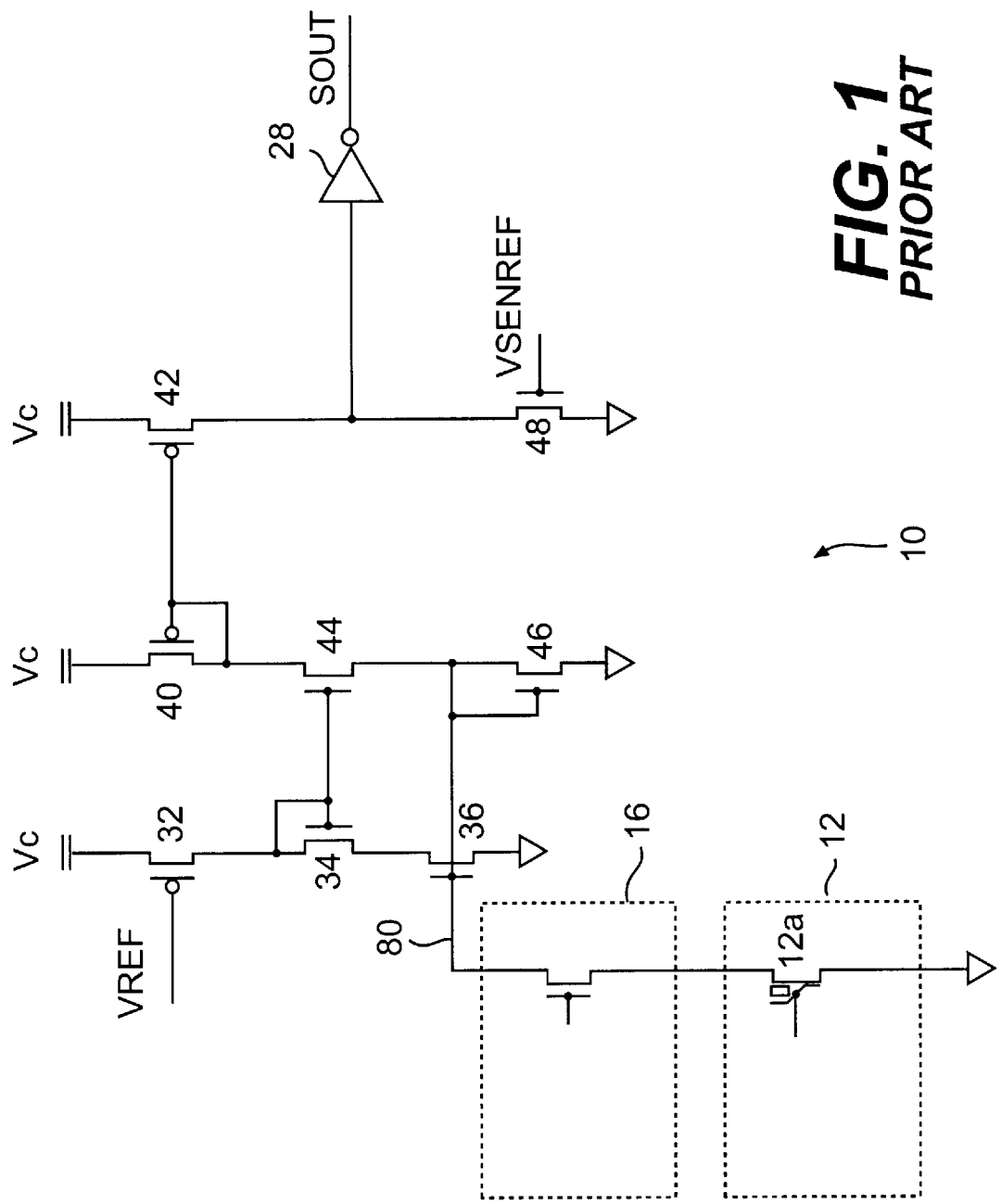
FIG. 1 is a schematic diagram of a known sensing circuit.

In accordance with the present invention, there is provided a sensing circuit for a non-volatile memory device. FIG. 2 is a diagram of an embodiment of the present invention. Referring to FIG. 2, a sensing circuit 50 includes a plurality of MOS transistors. Sensing circuit 50 is connected to a memory array 52 that includes a plurality of non-volatile memory cells 52a, 52b . . . 52n, only one of which (52a) is shown. Memory array 52 is connected to a sensing line 54 through a multiplexer 56. Sensing line 54 connects to the gate of an n-type transistor 58. The source of transistor 58 is connected to a ground potential and the drain is connected to the N, source of an n-type transistor 60. The drain of transistor 60 is connected to the drain of a p-type transistor 62. The gate of transistor 62 is connected to a reference potential $V_{REF1}$, and the source is connected to a voltage potential $V_c$. Transistors 62, 60, and 58 operate as a voltage amplifier.

The gate of transistor 60 is connected to the source of an n-type transistor 64. The drain of transistor 64 is connected to the drain and the gate of a p-type transistor 66, and also the gate of a p-type transistor 68. The source of transistor 66 and the source of transistor 68 are connected to voltage potential $V_c$. Transistors 66, 64, and 68 operate as a current mirror. The current mirror generates through transistor 68 a first current in response to one binary state of the memory cell being sensed, for example, memory cell 52a, and a second current in response to another binary state of the sensed memory cell. The current mirror additionally includes a p-type transistor 74, the source of which is connected to voltage potential $V_c$. The gate of transistor 74 is provided with a clock signal EQSA3, and the drain of transistor 74 is connected to the gate of transistor 68 and to the gate and the drain of transistor 66.

The current mirror is also connected to the drain and the gate of transistor 60 to create a feedback circuit between the current mirror and transistor 60. Specifically, the drain of transistor 60 is connected to the gate of transistor 64, and the gate of transistor 60 is connected to the source of transistor 64, creating a feedback circuit between transistors 60 and 64. A feedback loop is formed with inverter 70 through an n-type transistor 76. The drain and source of transistor 76 are connected to the input and output of inverter 70, respectively. The gate of transistor 76 is provided with a clock signal EQSA to trigger a sensing operation of sensing circuit 50.

Sensing line 54 additionally connects to the drain and the gate of an n-type transistor 78. The drain and the gate of transistor 78 are also connected to the source of transistor 64 and to the gate of transistor 60, in addition to the gate of transistor 58. The source of transistor 78 is connected to a ground potential.

Referring again to transistor 68, the drain of transistor 68 is connected to the drain of an n-type transistor 72. The gate of transistor 72 is connected to reference voltage $V_{SENREF}$, and the source of transistor 72 is connected to a ground potential. $V_{SENREF}$ may be generated and is used like the $V_{SENREF}$ in the circuitry of the '158 patent. The drain of transistor 72 is also connected to a pass gate 80, comprised of a p-type transistor and an n-type transistor within their respective source and drain regions connected together. Pass gate 80 has four terminals. A first terminal connects to the drains of transistors 68 and 72. A second terminal is provided with a clock signal EQSA2 and is connected to the input of an inverter 82. A third terminal of pass gate 80 is connected to the input of inverter 70 and the drain of transistor 76. A fourth terminal of pass gate 80 is connected to the output of inverter 82.

Each of clock signals EQSA, EQSA2, and EQSA3 includes a pulse having a peak-to-peak amplitude of $V_c$. The duration of the EQSA pulse is longer than that of the EQSA2. The duration of the EQSA2 pulse is longer than that of the EQSA3 pulse. Each clock signal is triggered at the beginning of the sensing operations of sensing circuit 50, and each clock signal is turned off after sensing circuit 50 reaches the linear operating region.

In operation, when the memory cell being sensed, in this example cell 52a, is in a conductive state, current flows in sensing line 54, and transistor 60 generates a voltage to maintain the voltage at sensing line 54. The feedback circuit between transistor 60 and the current mirror, comprised of transistors 66, 64, and 68, stabilizes the voltage generated by transistor 60. Specifically, because the feedback circuit is created between transistors 60 and 64, as the gate-to-source voltage, $V_{gs}$, of transistor 60 increases, the $V_{gs}$ of transistor 64 decreases. Conversely, when the $V_{gs}$ of transistor 60 decreases, the $V_{gs}$ of transistor 64 increases. Therefore, during the transient period, defined as from the cut-off region when sensing circuit 50 is first enabled until sensing circuit 50 reaches the linear operating region, the voltage generated by transistor 60 remains stable and does not generate any transition output noise.

During the conductive state, current also flows from transistor 66, through transistor 64, to sensing line 54 to maintain the conductive state of memory cell 52a. Since transistors 66, 64 and 68 constitute a current mirror, a current of the same magnitude also flows through transistor 68, and if pass gate 80 is turned on, to inverter 70. Transistor 74 provides an external current to bring transistor 66 and 68, which are initially off, to linear operating region quickly. Specifically, clock signal EQSA3, the duration of which is very brief, turns on transistor 74, which, in turn, provides a large external current to the gates of transistors 66 and 68 almost instantaneously to bring transistors 66 and 68 to the linear operating region. However, because the current provided by transistor 74 is very large, transient noises may be produced at inverter 70. Therefore, in a preferred embodiment, the present invention uses a combination of pass gate 80 and inverter 82 to eliminate possible transient noise.

Specifically, when EQSA2 is high, inverter 82 inverts the high input to a low output, which turns pass gate 80 off. Therefore, no signal will reach inverter 70 and no transient noise can be generated at the output of the sensing circuit. It is at this moment that EQSA3 turns on transistor 74 to provide the external current to transistors 66 and 68. After transistors 66 and 68 are brought to the linear operating region, EQSA3 turns off transistor 74 and EQSA2 changes to a low signal. Inverter 82, in turn, provides a high output to pass gate 80, thereby turning on pass gate 80 to allow signals to pass through to inverter 70, which provides an output of the sensing circuit.

In response to the current generated by transistors 66, 64, and 68, inverter 70 generates a first output signal in response to the first current, which corresponds to a conductive state of memory cell 52a and a second output signal in response to the second current, which corresponds to a non-conductive state of memory cell 52a. Transistor 76 creates a feedback loop for inverter 70 to stabilize output $S_{OUT\_}$ by moving the operating point of inverter 70 to approximately one-half of $V_c$.

Although the foregoing discussion is limited to components of specific conductivity-types, the present invention should not be limited to the foregoing components. It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A sensing circuit for sensing the binary state of a memory cell in a non-volatile memory device, comprising:

an amplifier electrically connected to the memory cell;

a first transistor having first and second spaced-apart regions and a gate, said first spaced-apart region connected to a first voltage source and said gate connected to said second spaced-apart region;

a second transistor having first and second spaced-apart regions and a gate, said first spaced-apart region of said second transistor connected to said gate and said second spaced-apart region of said first transistor, and said gate and said second spaced-apart region of said second transistor connected to said amplifier wherein a feedback circuit is created between said second transistor and said amplifier;

a third transistor having first and second spaced-apart regions and a gate, said first spaced-apart region connected to said first voltage source, and said gate of said third transistor connected to said gate and said second-spaced apart region of said first transistor wherein a first current is generated in response to one binary state of the memory cell and a second current is generated in response to another binary state of the memory cell;

a fourth transistor having first and second spaced-apart regions and a gate, said first spaced-apart region connected to said first voltage source, said gate provided with a first clock signal, and said second spaced-apart region connected to said gate of said first transistor and said gate of said third transistor; and means, connected to said second spaced-apart region of said third transistor, for producing a first output signal in response to said first current and a second output signal in response to said second current.

2. The sensing circuit as claimed in claim 1 further comprising a fifth transistor having first and second spaced-apart regions and a gate, said first spaced-apart region connected to an input of said means for producing output signals, said second spaced-apart region connected to an output of said means for producing output signals, and said gate provided with a second clock signal.

3. The sensing circuit as claimed in claim 1 wherein said first, third and fourth transistors are p-type transistors and said second transistor is an n-type transistor.

4. The sensing circuit as claimed in claim 1 wherein said first spaced-apart region of said first transistor is a source region and said first spaced-apart region of said second transistor is a drain region.

5. The sensing circuit as claimed in claim 2 wherein said first clock signal has a pulse of a first duration and said second clock signal has a pulse of a second duration.

6. The sensing circuit as claimed in claim 5 wherein said second duration is longer than said first duration.

7. The sensing circuit as claimed in claim 1 further including means, connected to said second spaced-apart region of said third transistor, for reducing transient noise in said output signals during the initial phase of operation of said first and third transistors.

8. The sensing circuit as claimed in claim 7 wherein said means for reducing transient noise includes:

means for passing current having first, second, third and fourth terminals, said first terminal connected to said second spaced-apart region of said third transistor, said second terminal provided with a third clock signal, and said third terminal connected to said input of said first inverter means; and an inverter having an input and an output, said output of said inverter connected to said fourth terminal of said means for passing current, and said input of said inverter connected to said second terminal of said means for passing current and to said third clock signal.

9. The sensing circuit as claimed in claim 1 wherein said means for producing output signals comprises an inverter.

10. The sensing circuit as claimed in claim 8 wherein said means for passing current comprises a pass gate.

11. The sensing circuit as claimed in claim 8 wherein said first clock signal has a pulse of a first duration, and said third clock signal has a pulse of a third duration.

12. The sensing circuit as claimed in claim 11 wherein said third duration is longer than said first duration.

13. A sensing circuit for sensing the binary state of a memory cell in a non-volatile memory device, comprising:

a first transistor having first and second spaced-apart regions and a gate, said first spaced-apart region connected to a first voltage source, and said gate connected to a second voltage source;

a second transistor having first and second spaced-apart regions and a gate, said first spaced-apart region of said second transistor connected to said second spaced-apart region of said first transistor;

a third transistor having first and second spaced-apart regions and a gate, said first spaced-apart region connected to said second spaced-apart region of said second transistor, said gate connected to the memory cell, and said second spaced-apart region connected to a ground potential;

means for generating a first current in response to one binary state of the memory cell and a second current in response to another binary state of the memory cell, said means for generating currents connected to said first spaced-apart region and said gate of said second transistor wherein a feedback circuit is created between said means for generating currents and said second transistor; and means, connected to said means for generating currents, for producing a first output signal in response to said first current and a second output signal in response to said second current; and means, connected to an output of said means for generating currents, for reducing transient noise in said output signals during the initial phase of operation of said means for generating currents.

14. The sensing circuit as claimed in claim 13 wherein said means for reducing transient noise include:

means for passing current having first, second, third and fourth terminals, said first terminal connected to said output of said means for generating currents, said second terminal provided with a third clock signal, and said third terminal connected to an input of said means for producing output signals; and an inverter having an input and an output, said output of said inverter connected to said fourth terminal of said means for passing current, and said input of said inverter connected to said second terminal of said means for passing current and to said third clock signal.

15. The sensing circuit as claimed in claim 13 wherein said means for generating currents includes:
  a fourth transistor having first and second spaced-apart regions and a gate, said first spaced-apart region connected to said first voltage source and said gate connected to said second spaced-apart region;
  a fifth transistor having first and second spaced-apart regions and a gate, said first spaced-apart region of said fifth transistor connected to said gate and said second spaced-apart region of said fourth transistor, said gate of said fifth transistor connected to said second spaced-apart region of said first transistor and to said first spaced-apart region of said second transistor, and said second spaced-apart region of said fifth transistor connected to said gate of said second transistor and to said gate of said third transistor, wherein said feedback circuit is created between said second transistor and said fifth transistor; and
  a sixth transistor having first and second spaced-apart regions and a gate, said first spaced-apart region connected to said first voltage source, said gate of said sixth transistor connected to said gate and said second-spaced apart region of said fourth transistor, and said second spaced-apart region connected to said means for producing output signals.

16. The sensing circuit as claimed in claim 15 further including means for enhancing the speed of said fourth and sixth transistors to reach linear operating regions from cut-off regions.

17. The sensing circuit as claimed in claim 16 wherein said operating speed enhancing means includes a seventh transistor having first and second spaced-apart regions and a gate, said first spaced-apart region connected to said first voltage source, said gate provided with a first clock signal, and said second spaced-apart region connected to said gate of said fourth transistor and to said gate of said sixth transistor.

18. The sensing circuit as claimed in claim 13 wherein said means for producing output signals includes a feedback loop.

19. The sensing circuit as claimed in claim 18 wherein said feedback loop of said means for producing output signals includes an eighth transistor having a gate provided with a second clock signal.

20. A sensing circuit for sensing the binary state of a memory cell in a non-volatile memory device, comprising:
  an amplifier electrically connected to the memory cell;
  means for generating a first current in response to one binary state of the memory cell and a second current in response to another binary state of the memory cell wherein said means for generating currents is connected to said amplifier;
  means, connected to said means for generating currents, for producing a first output signal in response to said first current and a second output signal in response to said second current; and
  means, connected to said means for generating currents, for reducing transient noise in said output signals during the initial phase of operation of said means for generating currents.

21. The sensing circuit as claimed in claim 20 wherein the means for reducing transient noise includes:
  means for passing current having first, second, third and fourth terminals, said first terminal connected to an output of said means for generating currents, said second terminal provided with a third clock signal, and said third terminal connected to an input of said means for producing output signals; and
  an inverter having an input and an output, said output of said inverter connected to said fourth terminal of said means for passing current, and said input of said inverter connected to said second terminal of said means for passing current and to said third clock signal.

22. The sensing circuit as claimed in claim 20 further including means, connected to said means for generating currents, for enhancing the speed of initialization of operation of said means for generating currents.

* * * * *